(12) United States Patent
Rami et al.

(10) Patent No.: US 11,621,334 B2
(45) Date of Patent: Apr. 4, 2023

(54) NON-PLANAR INTEGRATED CIRCUIT STRUCTURES HAVING ASYMMETRIC SOURCE AND DRAIN TRENCH CONTACT SPACING

(71) Applicant: Intel Corporation, Santa Clara, CA (US)

(72) Inventors: Said Rami, Portland, OR (US); Hyung-Jin Lee, Portland, OR (US); Surej Ravikumar, Hillsboro, OR (US); Kinyip Phoa, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 918 days.

(21) Appl. No.: 16/260,600

(22) Filed: Jan. 29, 2019

(65) Prior Publication Data

US 2020/0243655 A1    Jul. 30, 2020

(51) Int. Cl.
| | |
|---|---|
| *H01L 29/417* | (2006.01) |
| *H01L 29/66* | (2006.01) |
| *H01L 29/78* | (2006.01) |
| *H01L 27/088* | (2006.01) |
| *H01L 29/06* | (2006.01) |
| *H01L 29/08* | (2006.01) |
| *H01L 27/12* | (2006.01) |
| *G06F 13/10* | (2006.01) |

(52) U.S. Cl.
CPC ........ *H01L 29/41791* (2013.01); *G06F 13/10* (2013.01); *H01L 27/0886* (2013.01); *H01L 27/12* (2013.01); *H01L 29/0642* (2013.01); *H01L 29/0673* (2013.01); *H01L 29/0847* (2013.01); *H01L 29/66659* (2013.01); *H01L 29/66795* (2013.01); *H01L 29/7843* (2013.01); *H01L 29/7851* (2013.01)

(58) Field of Classification Search
CPC ................. H01L 29/66659; H01L 29/41791
See application file for complete search history.

(56) References Cited

U.S. PATENT DOCUMENTS

| | | | | |
|---|---|---|---|---|
| 2015/0144880 | A1* | 5/2015 | Rachmady | .......... H01L 29/7848 257/24 |
| 2015/0311342 | A1* | 10/2015 | Lin | .................... H01L 29/66659 257/190 |
| 2019/0096883 | A1* | 3/2019 | Chen | .................... H01L 29/0649 |

* cited by examiner

*Primary Examiner* — Farun Lu
(74) *Attorney, Agent, or Firm* — Schwabe, Williamson & Wyatt, P.C.

(57) ABSTRACT

Embodiments of the disclosure are in the field of advanced integrated circuit structure fabrication. In an example, an integrated circuit structure includes a fin including silicon. A gate structure is over the fin, the gate structure having a center. A conductive source trench contact is over the fin, the conductive source trench contact having a center spaced apart from the center of the gate structure by a first distance. A conductive drain trench contact is over the fin, the conductive drain trench contact having a center spaced apart from the center of the gate structure by a second distance, the second distance greater than the first distance by a factor of three.

18 Claims, 9 Drawing Sheets

NON-PLANAR INTEGRATED CIRCUIT STRUCTURES HAVING ASYMMETRIC SOURCE AND DRAIN TRENCH CONTACT SPACING

TECHNICAL FIELD

Embodiments of the disclosure are in the field of advanced integrated circuit structure fabrication and, in particular, non-planar integrated circuit structures having asymmetric source and drain trench contact spacing.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1B:
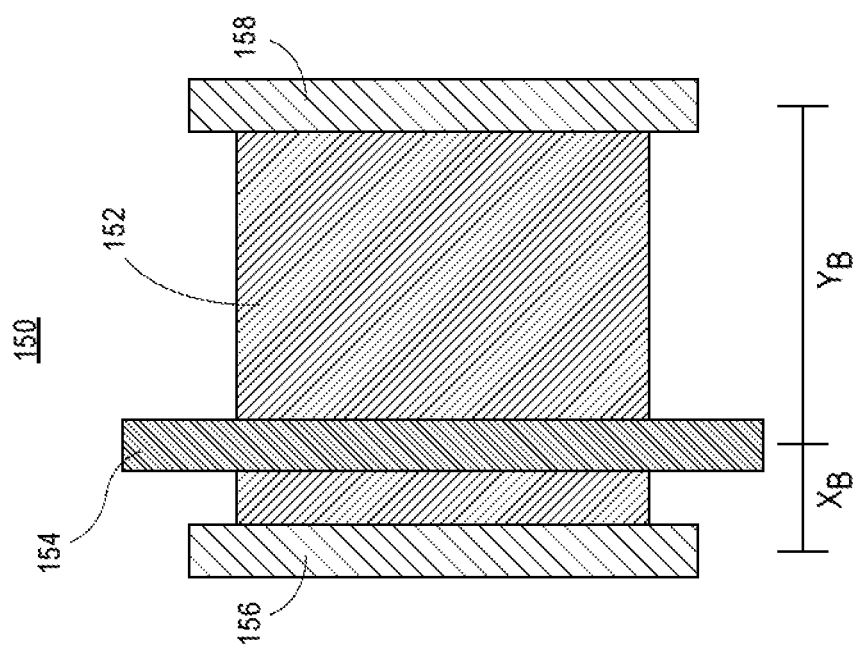
FIG. 1B illustrates a plan view of a non-planar integrated circuit structure having asymmetric source and drain trench contact spacing, in accordance with an embodiment of the present disclosure.

Advanced integrated circuit structure fabrication is described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to "skip" trench contact (TCN) or "wide" trench contact (TCN) structures for fabricating devices having Fmax(Gmax) enhancement with improved breakdown.

To provide context, Radio Frequency Integrated Circuit (RFIC) and Millimeter Wave Integrated Circuit implementation requires active device components providing higher maximum oscillation frequency (Fmax) or the maximum available gain (Gmax) at the operation frequency. This device property is crucial to deliver the signal power through the transceiver chains and the signal power should be sufficient to overcome the propagation loss over the medium (usually air) with reasonable system power dissipation. FinFET technology may exhibit drawbacks with respect to parasitic capacitance due to the three-dimensional (3D) structure. As a result, many foundries report lower Fmax as compared with planar technology. This may be a significant obstacle for wireless application design to migrate into FinFET technology.

One or more embodiments described herein may be implemented to boost the Fmax, thus Gmax of the corresponding FinFET technology, by reducing gate-to-drain parasitic capacitance. Gate-to-drain parasitic capacitance has been identified as the source of signal feedback limiting maximum Fmax. Also, embodiments of the present disclosure may be implemented to increase drain resistance, similar to Extended-Drain MOS (EDMOS). The increased drain resistance may support higher gate-drain oxide breakdown voltage by reducing the actual drain voltage at the interface to the device channel as well as to the gate oxide. The higher breakdown voltage may enhance maximum voltage swing, and hence the maximum output signal power.

To provide further context, breakdown voltage can be resolved by using an EDMOS structure for higher voltage, but low frequency applications. However, disadvantages to the above approaches may include the realization that EDMOS exhibits very poor Fmax performance due to an extremely long channel. Therefore, EDMOS may not be suitable for high frequency applications.

Fmax limitation is traditionally handled by planar technology, SiGe or SOI process technology. Typically, wireless communication applications utilize planar technology for low cost solutions, or more expensive process technology solution, such as SiGe and SOI for the Fmax benefit. However, planar technology, SiGe and SOI processes may not be as power efficient as FinFET technology due to the poor gate-channel controllability and the poor analog performance due to the Drain-Induced-Barrier-Lowering (DIBL) effect. On the other hand, FinFET structures offer superior channel controllability and, hence, sharp sub-threshold transition and the superior short-channel effect, thus higher output impedance.

In accordance with an embodiment of the present disclosure, asymmetric FinFET transistor structures are proposed where the drain TCN contact is extended away from an active gate structure. In one embodiment, such a structure is achieved by skipping the TCN location and active gate location immediately adjacent to active gate on the drain side. The source TCN contact is maintained closer to the active gate structure. In a specific embodiment, pitch multiples are maintained to not incur extra cost. Also, epitaxial formation on the drain side adjacent to active gate may be blocked to reduce the gate-to-drain parasitic capacitance. In another embodiment, varying TCN critical dimension (CD) relative to a standard CD may be used in addition to skipping TCN and POLY for further optimization of such a transistor for high current density.

Advantages of implementing one or more embodiments described herein may be implemented to provide relatively higher Fmax and breakdown voltages than ordinary FinFET transistors. In one embodiment, Fmax is improved as the gate-to-drain capacitance is minimized. In one embodiment, the breakdown voltage is improved as the field between gate and drain is distributed over extended drain area. In one embodiment, on the source side the TCN location is maintained at the original location to prevent source degeneration. In an embodiment, the resulting asymmetric topology is useful in circuits such as power amplifiers. Additionally, embodiments may be implemented in a process fabrications scheme without or essentially without any added process cost. Embodiments described herein may be implemented to fabricate distinct structures for non-planar devices which may include one or both of an asymmetric TCN arrangement around the active transistor, and uneven source versus drain structure height due to a blocked epitaxial growth in the drain area which may improve gate-to-drain capacitance.

Figure 1A:
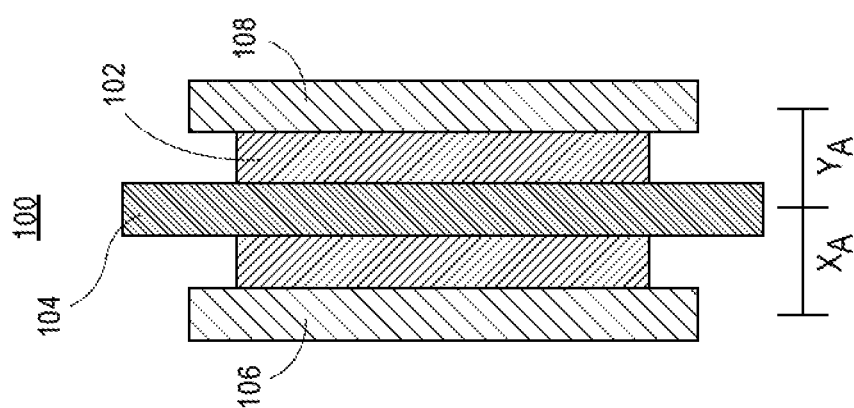
FIG. 1A illustrates a plan view of a non-planar integrated circuit structure having symmetric source and drain trench contact spacing.

In an exemplary comparison, FIG. 1A illustrates a plan view of a non-planar integrated circuit structure having symmetric source and drain trench contact spacing. FIG. 1B illustrates a plan view of a non-planar integrated circuit structure having asymmetric source and drain trench contact spacing, in accordance with an embodiment of the present disclosure.

Referring to FIG. 1A, an integrated circuit structure 100 includes a fin 102 including silicon. A gate structure 104 is over the fin. The gate structure 104 has a center. A conductive source trench contact 106 is over the fin 102. The conductive source trench contact 106 has a center spaced apart from the center of the gate structure 104 by a first distance $X_A$. A conductive drain trench 108 contact is over the fin 102. The conductive drain trench contact 108 has a center spaced apart from the center of the gate structure 104 by a second distance $Y_A$. The second distance $Y_A$ is the same as the first distance $X_A$.

In contrast to FIG. 1A, referring to FIG. 1B, an integrated circuit structure 150 includes a fin 152 including silicon. A gate structure 154 is over the fin 152. The gate structure 154 has a center. A conductive source trench contact 156 is over the fin 152. The conductive source trench contact 156 has a center spaced apart from the center of the gate structure 154 by a first distance $X_B$. A conductive drain trench 158 contact is over the fin 152. The conductive drain trench contact 158 has a center spaced apart from the center of the gate structure 154 by a second distance $Y_B$. In an embodiment, the second distance $Y_B$ is greater than the first distance $X_B$ by a factor of three. It is to be appreciated that reference to a factor of 3 may refer to a factor of precisely 3 of essentially 3, allowing accommodation for slight processing variation.

In an embodiment, not depicted in FIG. 1B but examples of which are described in greater detail below, a dummy gate structure is over the fin 152 and between the gate structure 154 and the conductive drain trench contact 158. In one such embodiment, the dummy gate structure has a center spaced apart from the center of the gate structure 154 by a third distance. The third distance greater than the first distance $X_B$ by a factor of two. It is to be appreciated that reference to a factor of 2 may refer to a factor of precisely 2 of essentially 2, allowing accommodation for slight processing variation. In another embodiment, as depicted, a dummy gate structure is not located between the gate structure 154 and the conductive drain trench contact 158.

In an embodiment, not depicted in FIG. 1B but examples of which are described in greater detail below, a dummy trench contact structure over the fin 152 and between the gate structure 154 and the dummy gate structure. In one such embodiment, the dummy trench contact structure has a center spaced apart from the center of the gate structure by a fourth distance. The fourth distance is precisely or essentially the same as the first distance $X_B$.

In an embodiment, not depicted in FIG. 1B but examples of which are described in greater detail below, the conductive source trench contact 156 is on an epitaxial source structure in the fin 152. The conductive drain trench contact 158 is on an epitaxial drain structure in the fin 152. In one such embodiment, the epitaxial source structure and the epitaxial drain structure have a substantially same width and height. In an embodiment, an intervening epitaxial structure is in the fin 152 and between such a epitaxial source structure and epitaxial drain structure. In an embodiment, however, an intervening epitaxial structure is not included in the fin 152 between such an epitaxial source structure and epitaxial drain structure.

Referring to both FIGS. 1A and 1B, although only one gate structure is depicted for each, the gate structures may be fabricated in a process in which many gate structures are formed as a grating structure at a contact pitch to form a grating structure, as is described in greater detail below. The conductive source trench contacts and the conductive drain trench contacts may be formed as structures intervening with the grating of gate structures. It is to be appreciated that the plan views shown illustrate gate structures formed over fins that are represented as relatively larger areas than would be expected from a structure perspective, where the larger areas represent the Z (total body dimension) of the fin as captured in a plan view.

Referring again to FIGS. 1A and 1B, integrated circuit structure 100 may represent a standard transistor where a source contact and a drain contact are symmetric with respect to the gate structure. Such a symmetric device is typically optimized for logic operation, as it used for switching. For RF/mmWave applications where the transistor is for providing gain, it may be desirable to minimize gate to drain capacitance as a result of the Miller Effect. Additionally, gate to drain interaction typically experiences the highest field in the transistor. Addressing this, in accordance with an embodiment of the present disclosure and with reference to FIG. 1B, the drain is extended further from the gate to provide improved breakdown characteristics.

Figure 2:
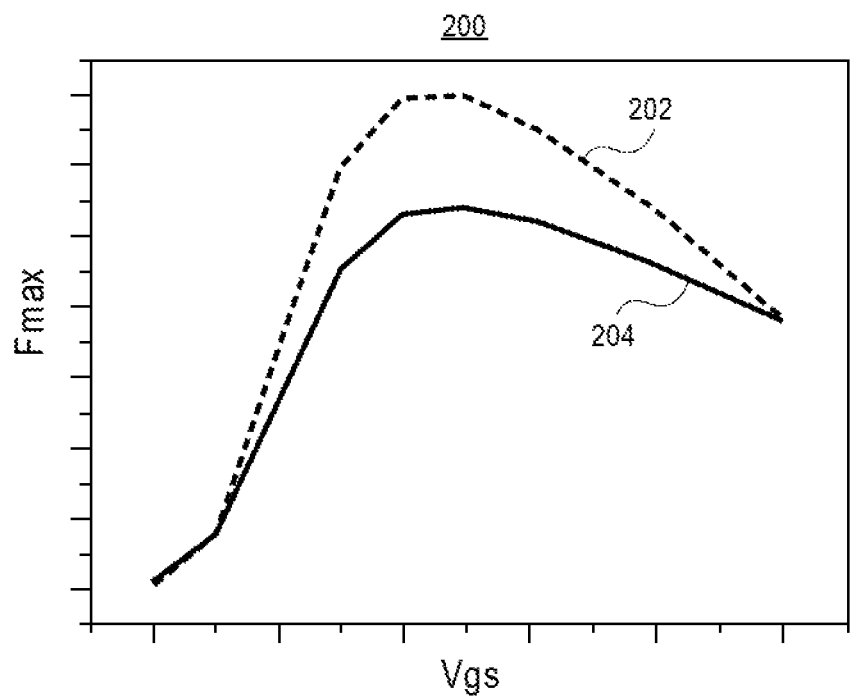
FIG. 2 is a plot of Fmax as a function of Vgs for an asymmetric transistor versus a symmetric transistor, in accordance with an embodiment of the present disclosure.

FIG. 2 is a plot 200 of Fmax as a function of Vgs for an asymmetric transistor 202 versus a symmetric transistor 204, in accordance with an embodiment of the present disclosure. Plot 200 demonstrates improved Fmax for asymmetric transistors relative to symmetric transistors.

Figure 3:
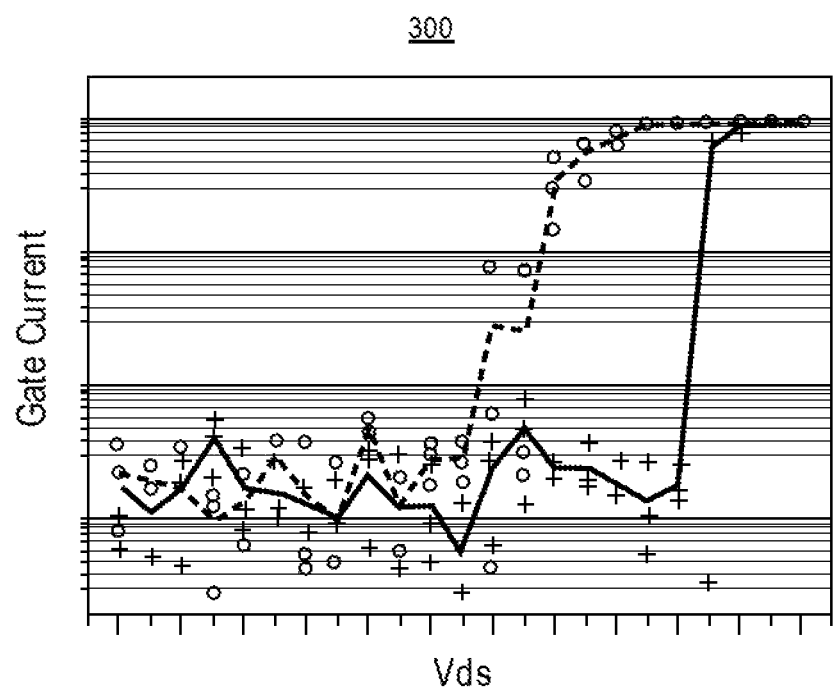
FIG. 3 is a plot of Gate Current as a function of Vds for an asymmetric transistor (solid line) versus a symmetric transistor (dashed line), in accordance with an embodiment of the present disclosure.

FIG. 3 is a plot 300 of Gate Current as a function of Vds for an asymmetric transistor (solid line) versus a symmetric transistor (dashed line), in accordance with an embodiment of the present disclosure. Plot 300 demonstrates improved breakdown voltage for asymmetric transistors relative to symmetric transistors.

In another aspect, in deeply scaled FinFET technologies, patterning of front end layers may be performed using a gridded or grating approach. For example, gate (Poly) pitch may be limited to specific values and is not set freely. Accommodating such limitations, in accordance with one or more embodiments described herein, an integrated circuit structure is fabricated maintaining the grid rules and the drain trench contact is placed on the following track (skip one TCN). In an embodiment, improvements of gate to drain capacitance and breakdown are achieved without any additional process/mask costs.

Figure 4B:
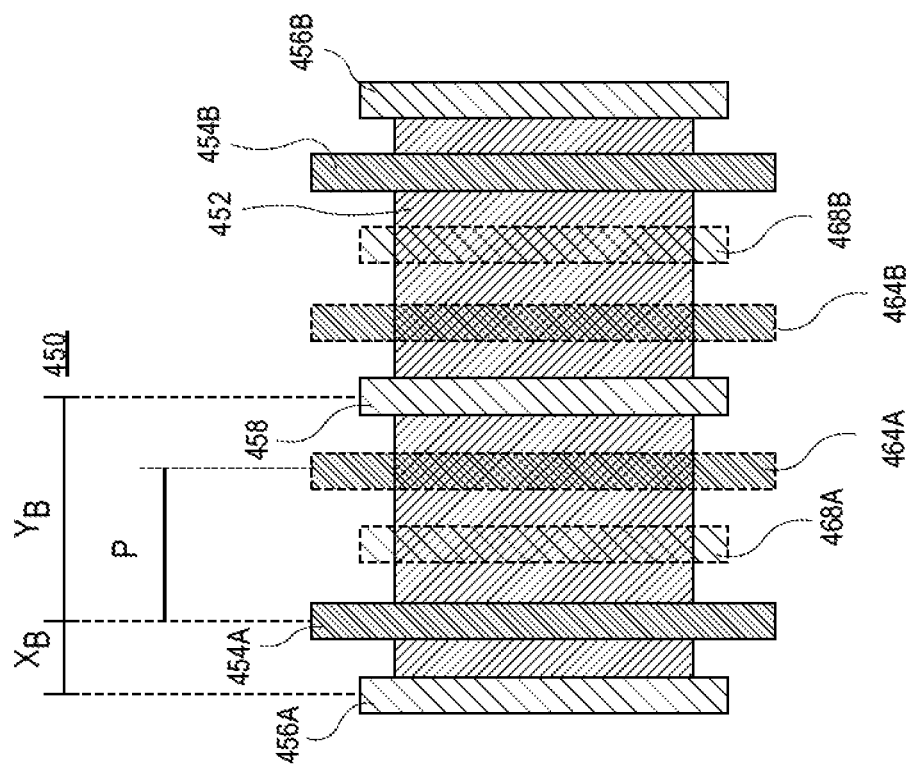
FIG. 4B illustrates a plan view of a non-planar integrated circuit structure having asymmetric source and drain trench contact spacing, in accordance with an embodiment of the present disclosure.
Figure 4A:
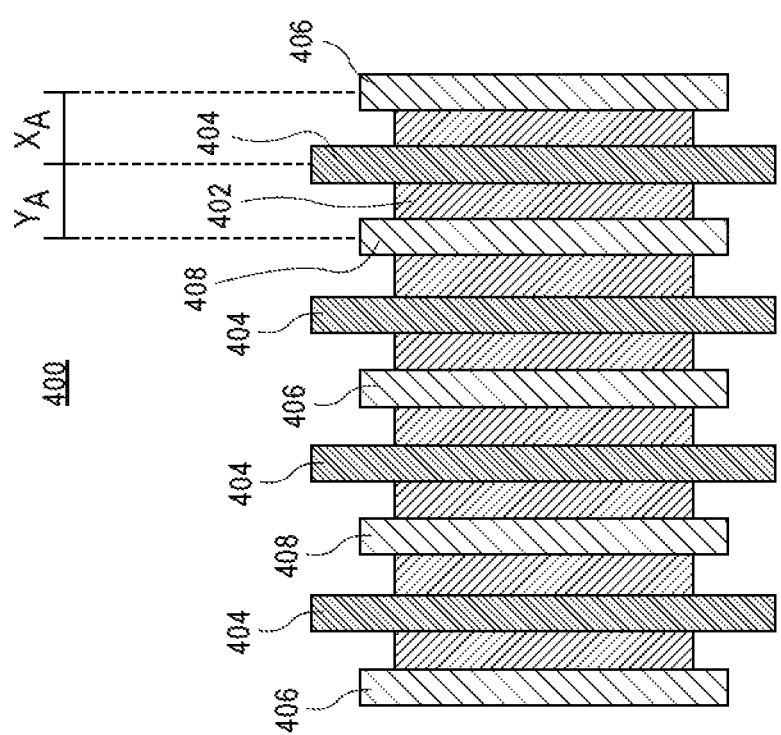
FIG. 4A illustrates a plan view of a non-planar integrated circuit structure having symmetric source and drain trench contact spacing.

In another exemplary comparison, FIG. 4A illustrates a plan view of a non-planar integrated circuit structure having symmetric source and drain trench contact spacing. FIG. 4B illustrates a plan view of a non-planar integrated circuit structure having asymmetric source and drain trench contact spacing, in accordance with an embodiment of the present disclosure.

Referring to FIG. 4A, an integrated circuit structure 400 includes a fin 402 including silicon. Gate structures 404 are over the fin 402. Conductive source trench contacts 406 and conductive drain trench contacts 408 are over the fin 452. The conductive source trench contacts 406 and conductive drain trench contacts 408 alternate as intervening structures between the gate structures 404. A nearest conductive source trench contact 406 has a center spaced apart from the center of a nearest gate structure 404 by a first distance $X_A$. A nearest conductive drain trench contact 408 has a center spaced apart from the center of a nearest gate structure 404 by a second distance $Y_A$. The second distance $Y_A$ is the same as the first distance $X_A$.

In contrast to FIG. 4A, referring to FIG. 4B, an integrated circuit structure 450 includes a fin 452 including silicon. A first conductive source trench contact (456A) is over the fin 452. A first gate structure 454A is over the fin 452 and neighboring the first conductive source trench contact 456A, the first gate structure 454A having a center. A first dummy gate structure 464A is over the fin 452 and neighboring the first gate structure 454A, the first dummy gate structure 464A having a center spaced apart from the center of the first gate structure 454A by a pitch P. A conductive drain trench contact 458 is over the fin 452 and neighboring the first dummy gate structure 464A. A second dummy gate structure 464B is over the fin 452 and neighboring the conductive drain trench contact 458. In one embodiment, the second dummy gate structure 464B has a center spaced apart from the center of the first dummy gate structure 464A by the pitch P. A second gate structure 454B is over the fin 452 and neighboring the second dummy gate structure 464B. In one embodiment, the second gate structure 454B has a center spaced apart from the center of the second dummy gate structure 464B by the pitch P. A second conductive source trench contact 456B is over the fin 452 and neighboring the second gate structure 454B. In an embodiment, dummy conductive drain trench contacts 468A and 468B are included over fin 452, as is depicted.

In an embodiment, conductive source trench contact 456A has a center spaced apart from the center of the gate structure 454A by a first distance $X_B$. Conductive drain trench contact 458 has a center spaced apart from the center of the gate structure 454A by a second distance $Y_B$. In an embodiment, the second distance $Y_B$ is greater than the first distance $X_B$ by a factor of three. It is to be appreciated that reference to a factor of 3 may refer to a factor of precisely 3 of essentially 3, allowing accommodation for slight processing variation.

In an embodiment, not depicted in FIG. 4B but examples of which are described in greater detail below, the first conductive source trench contact 456A is on a first epitaxial source structure in the fin 452. The conductive drain trench contact 458 is on an epitaxial drain structure in the fin 452. The second conductive source trench contact 456B is on a second epitaxial source structure in the fin 452. In one embodiment, a first intervening epitaxial structure is in the fin 452 and between such a first epitaxial source structure and epitaxial drain structure. A second intervening epitaxial structure in the fin 452 and between such a second epitaxial source structure and epitaxial drain structure. In another embodiment, however, an intervening epitaxial structure is not included in the fin 452 between such a first epitaxial source structure and epitaxial drain structure, and an intervening epitaxial structure is not included in the fin 452 between such a second epitaxial source structure and epitaxial drain structure.

Referring to both FIGS. 4A and 4B, the gate structures (including dummy gate structures) may be fabricated in a process in which many gate structures are formed as a grating structure at a contact pitch to form a grating structure, as is described in greater detail below. The conductive source trench contacts and the conductive drain trench contacts may be formed as structures intervening with the grating of gate structures. It is to be appreciated that the plan views shown illustrate gate structures formed over fins that are represented as relatively larger areas than would be expected from a structure perspective, where the larger areas represent the Z (total body dimension) of the fin as captured in a plan view.

Figure 5:
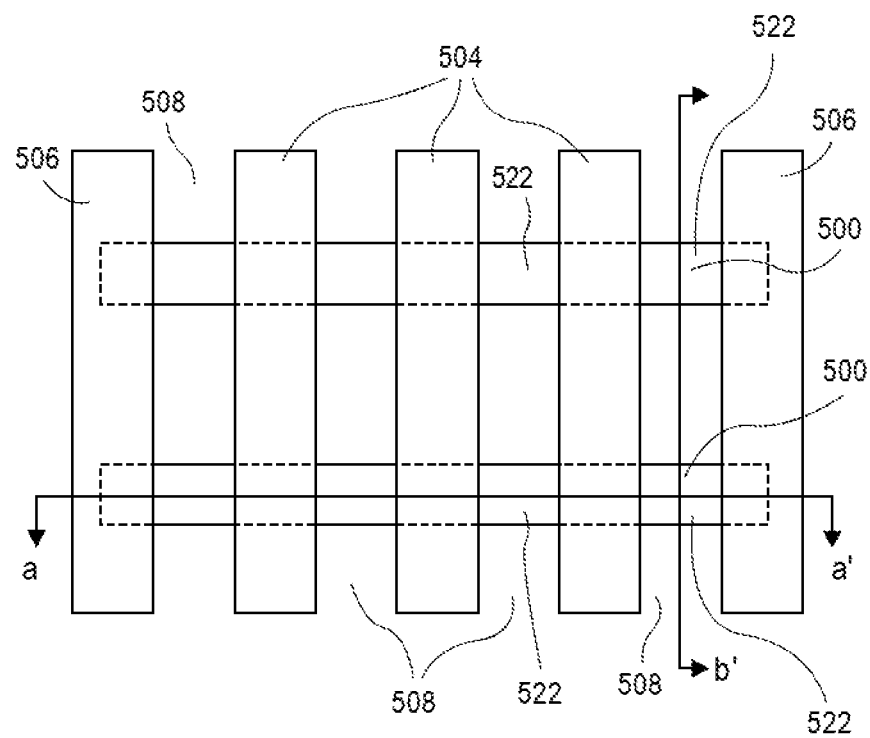
FIG. 5 illustrates a plan view of a plurality of gate lines over a pair of semiconductor fins, in accordance with an embodiment of the present disclosure.
Figure 6A:
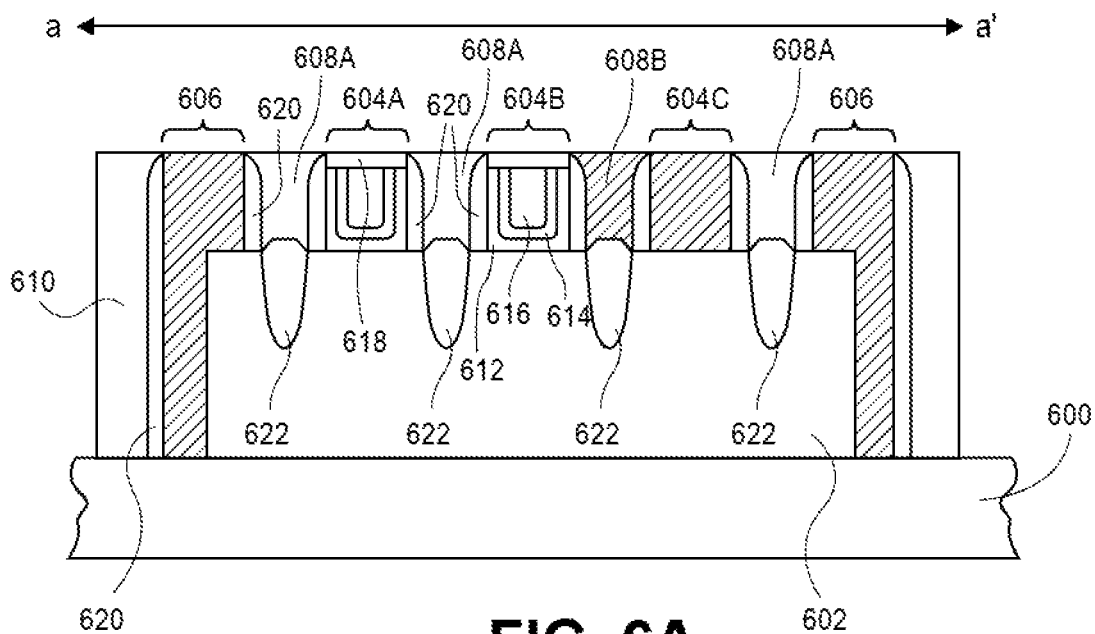
FIGS. 6A-6C illustrate cross-sectional views, taken along the a-a' axis of FIG. 5, for various non-planar integrated circuit structures having asymmetric source and drain trench contact spacing, in accordance with an embodiment of the present disclosure.
Figure 6B:
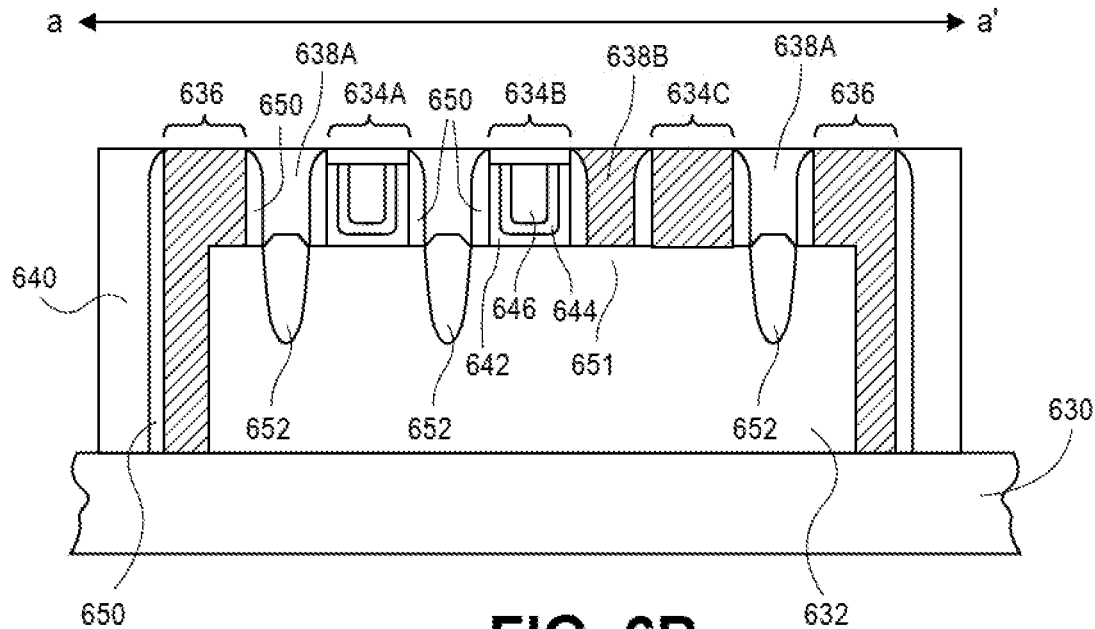
Figure 6C:
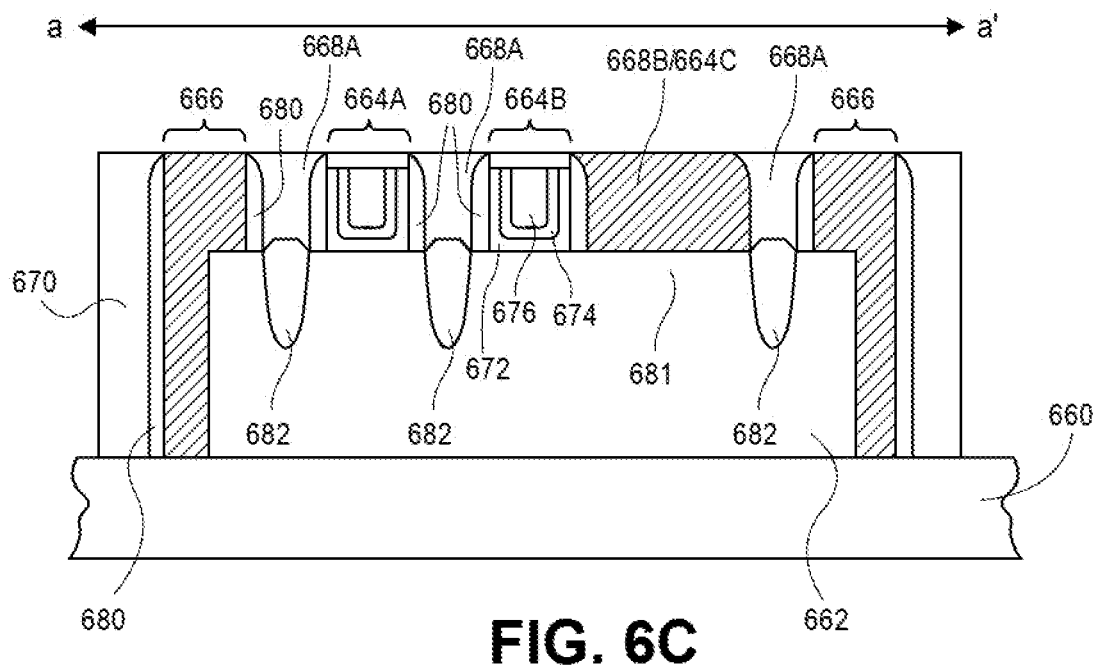

In another exemplary implementation, FIG. 5 illustrates a plan view of a plurality of gate lines over a pair of semiconductor fins, in accordance with an embodiment of the present disclosure. FIGS. 6A-6C illustrate cross-sectional views, taken along the a-a' axis of FIG. 5, for various non-planar integrated circuit structures having asymmetric source and drain trench contact spacing, in accordance with an embodiment of the present disclosure.

Referring to FIG. 5, a plurality of gate lines 504 is formed over a plurality of semiconductor fins 500. Dummy gate lines 506 are at the ends of the plurality of semiconductor fins 500. Spacings 508 between the gate lines 504/506 are locations where trench contacts may be formed as conductive contacts to source or drain regions, such as source or drain regions 522.

Referring to FIG. 6A, gate lines 604A, 604B and 604C are formed over a semiconductor fin 602 formed above a substrate 600. Dummy gate lines 606 are at the ends of the semiconductor fin 602. A dielectric layer 610 is outside of the dummy gate lines 606. Embedded source or drain structures 622 are in the semiconductor fin 602 between the gate lines 604A, 604B and 604C and dummy gate lines 606. Gate lines 604A and 604B are active gate lines that include a gate dielectric layer 612, a workfunction gate electrode portion 614 and a fill gate electrode portion 616, and a dielectric capping layer 618. In accordance with an embodiment of the present disclosure, gate line 604C is a dummy gate line. Dielectric spacers 620 line the sidewalls of the gate lines 604A, 604B and 604C and dummy gate lines 606. Trench contacts 608A and a dummy trench contact 608B are between the gate lines 604A, 604B and 604C and the dummy gate lines 606. In an embodiment, gate line 604B, trench contact 608A immediately to the left of gate line 604B, and trench contact 608A to the right of gate line 604B for an asymmetric transistor since trench contact 608A to the right of gate line 604B is spaced farther from gate line 604B than trench contact 608A immediately to the left of gate line 604B is spaced from gate line 604B.

Referring to FIG. 6B, gate lines 634A, 634B and 634C are formed over a semiconductor fin 632 formed above a substrate 630. Dummy gate lines 636 are at the ends of the semiconductor fin 632. A dielectric layer 640 is outside of the dummy gate lines 636. Embedded source or drain structures 652 are in the semiconductor fin 632 between the gate lines 634A, 634B and 634C and dummy gate lines 636. However, in accordance with an embodiment of the present disclosure, and embedded or epitaxial semiconductor region is not included in fin 632 at location 651, e.g., in the location between an extended drain region. Gate lines 634A and 634B are active gate lines that include a gate dielectric layer 642, a workfunction gate electrode portion 644 and a fill gate electrode portion 646, and a dielectric capping layer. In accordance with an embodiment of the present disclosure, gate line 634C is a dummy gate line. Dielectric spacers 650 line the sidewalls of the gate lines 634A, 634B and 634C and dummy gate lines 636. Trench contacts 638A and a dummy trench contact 638B are between the gate lines 634A, 634B and 634C and the dummy gate lines 636. In an embodiment, gate line 634B, trench contact 638A immediately to the left of gate line 634B, and trench contact 638A to the right of gate line 634B form an asymmetric transistor since trench contact 638A to the right of gate line 634B is spaced farther from gate line 634B than trench contact 638A immediately to the left of gate line 634B is spaced from gate line 634B.

Referring to FIG. 6C, gate lines 664A and 664B are formed over a semiconductor fin 662 formed above a substrate 660. Dummy gate lines 666 are at the ends of the semiconductor fin 662. A location 664C represents an omitted gate structure. A dielectric layer 670 is outside of the dummy gate lines 666. Embedded source or drain structures 682 are in the semiconductor fin 662 between the gate lines 664A, 664B and dummy gate lines 666. However, in accordance with an embodiment of the present disclosure, and embedded or epitaxial semiconductor region is not included in fin 662 at location 681, e.g., in the location between an extended drain region. Gate lines 664A and 664B are active gate lines that include a gate dielectric layer 672, a workfunction gate electrode portion 674 and a fill gate electrode portion 676, and a dielectric capping layer. Dielectric spacers 680 line the sidewalls of the gate lines 664A, 664B and dummy gate lines 666. Trench contacts 668A are between the gate lines 664A, 664B and the dummy gate lines 666. A location 668B represents an omitted trench contact structure. In an embodiment, gate line 664B, trench contact 668A immediately to the left of gate line 664B, and trench contact 668A to the right of gate line 664B form an asymmetric transistor since trench contact 668A to the right of gate line 664B is spaced farther from gate line 664B than trench contact 668A immediately to the left of gate line 664B is spaced from gate line 664B.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. Thus, contact over active gate (COAG) structures may be fabricated. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

More generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., TILA). The additional dielectric material is included as a trench contact dielectric cap layer with etch characteristics different from the gate dielectric material cap layer already used for trench contact alignment in a gate aligned contact process (GAP) processing scheme (e.g., GILA). However, in technologies where space and layout constraints are somewhat relaxed compared with current generation space and layout constraints, a contact to gate structure may be fabricated by making contact to a portion of the gate electrode disposed over an isolation region.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node or sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
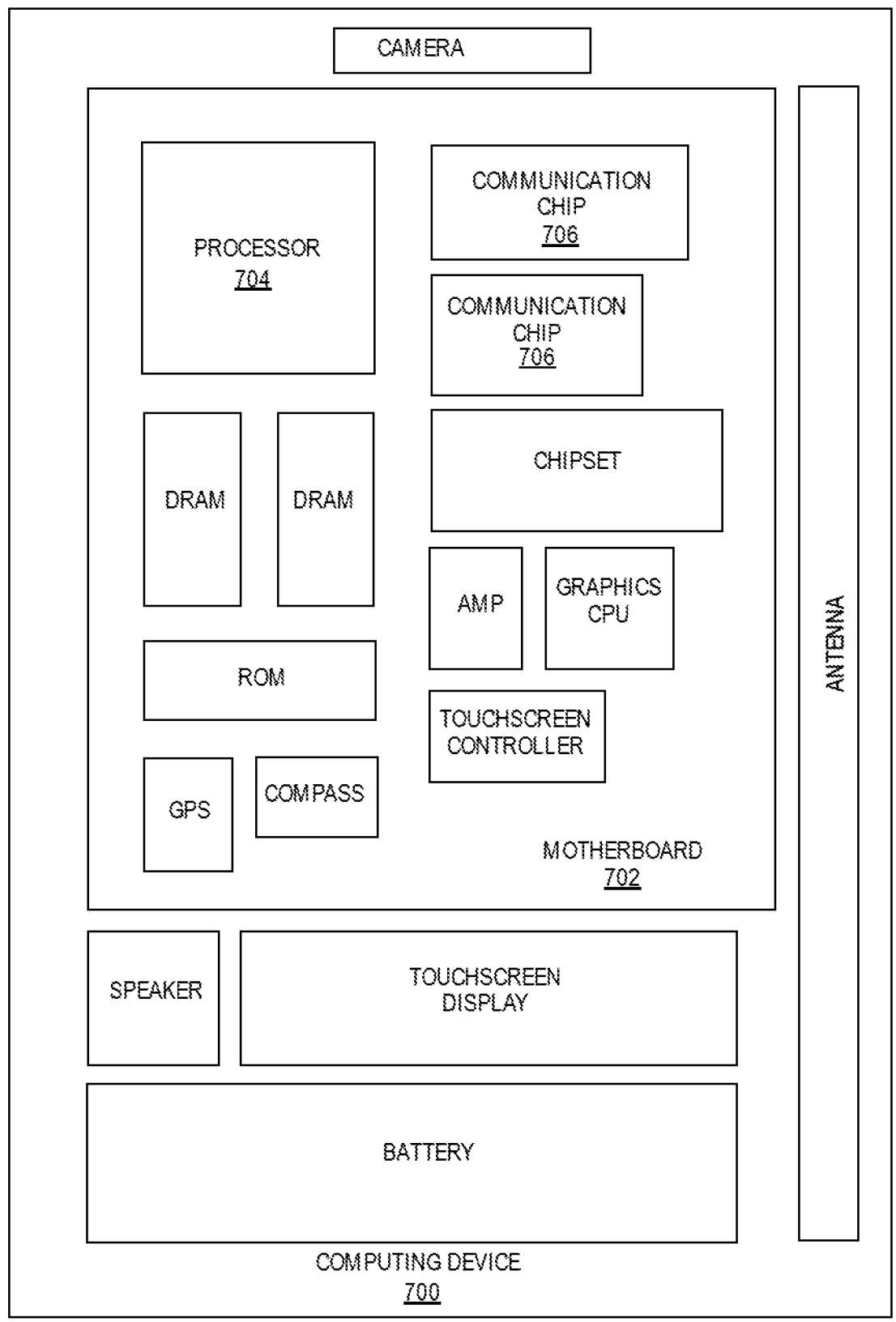
FIG. 7 illustrates a computing device in accordance with one implementation of the disclosure.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 706 also includes an integrated circuit die packaged within the communication chip 706. In accordance with another implementation of the disclosure, the integrated circuit die of the communication chip is built in accordance with implementations of the disclosure.

In further implementations, another component housed within the computing device 700 may contain an integrated circuit die built in accordance with implementations of embodiments of the disclosure.

In various embodiments, the computing device 700 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
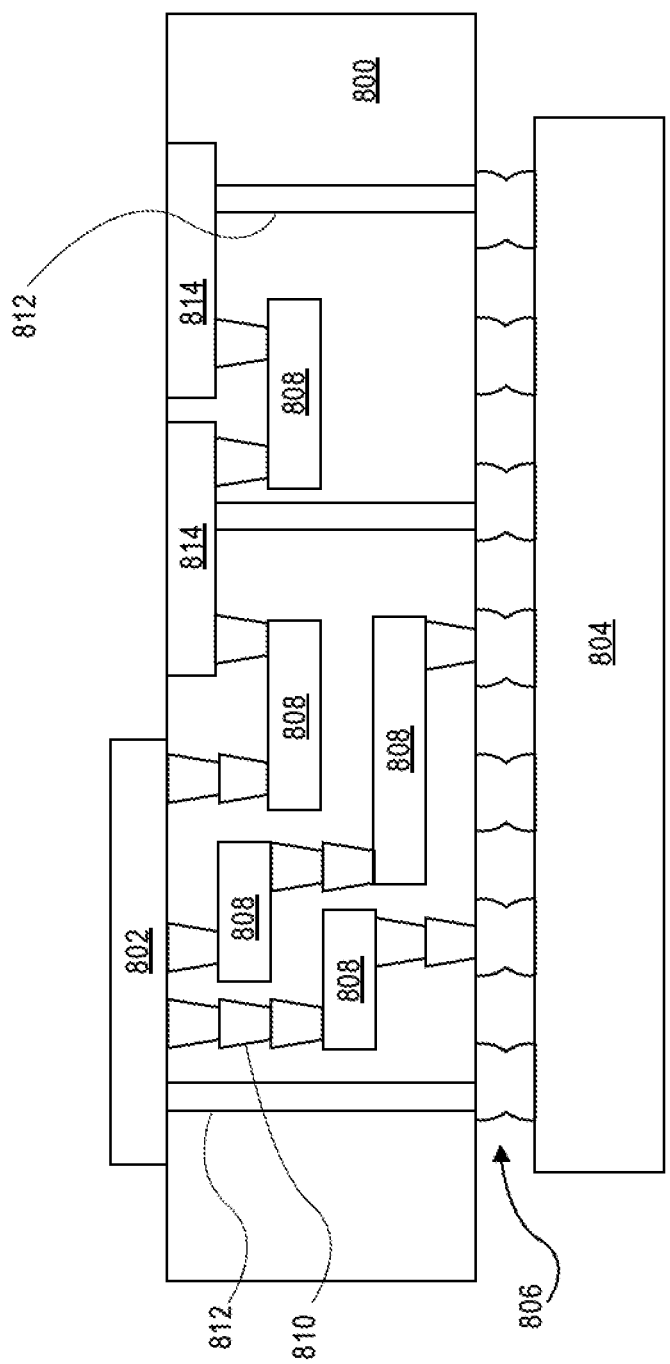
FIG. 8 illustrates an interposer that includes one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800 or in the fabrication of components included in the interposer 800.

Figure 9:
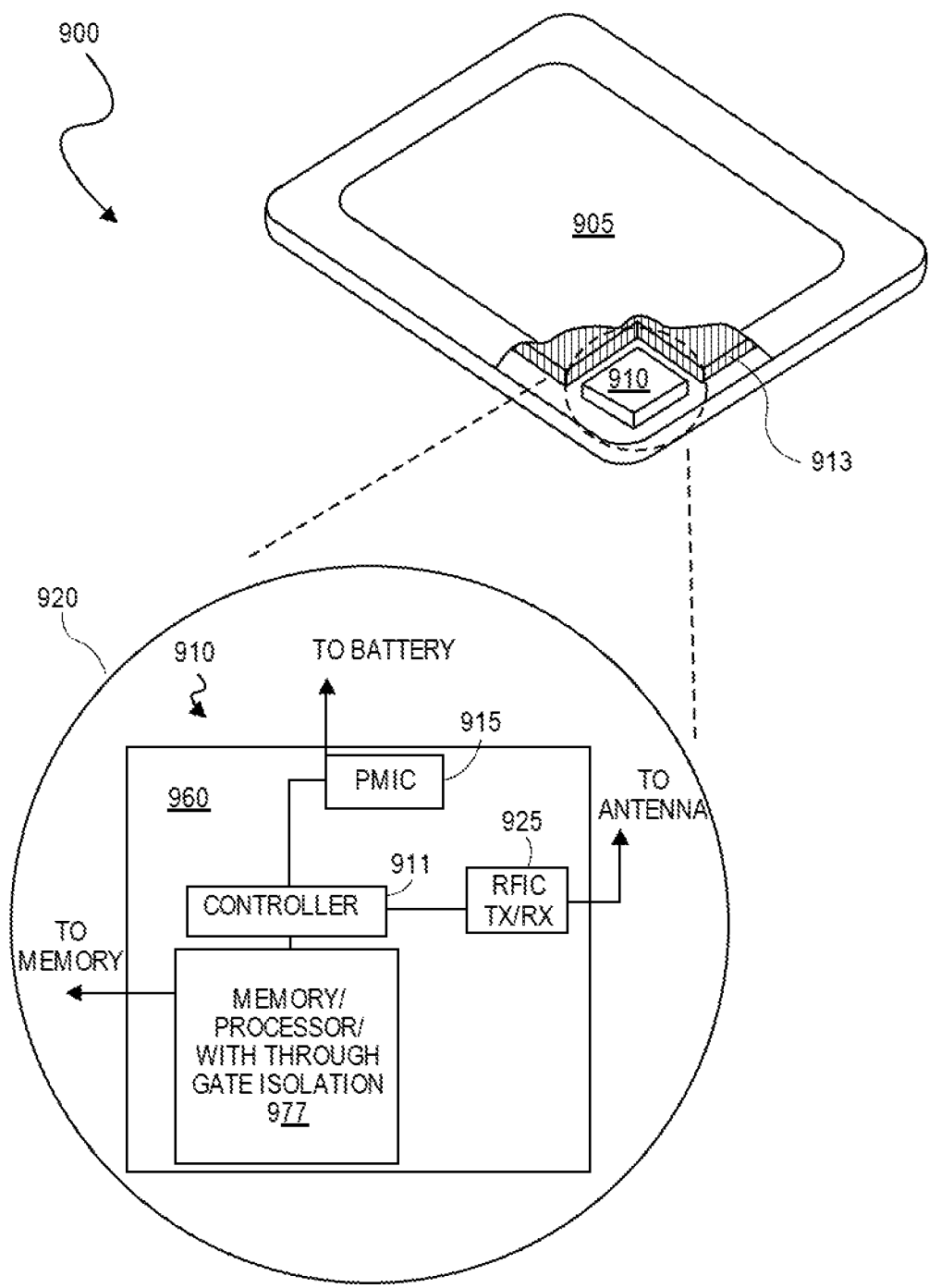
FIG. 9 is an isometric view of a mobile computing platform employing an IC fabricated according to one or more processes described herein or including one or more features described herein, in accordance with an embodiment of the present disclosure.

FIG. 9 is an isometric view of a mobile computing platform 900 employing an integrated circuit (IC) fabricated according to one or more processes described herein or including one or more features described herein, in accordance with an embodiment of the present disclosure.

The mobile computing platform 900 may be any portable device configured for each of electronic data display, electronic data processing, and wireless electronic data transmission. For example, mobile computing platform 900 may be any of a tablet, a smart phone, laptop computer, etc. and includes a display screen 905 which in the exemplary embodiment is a touchscreen (capacitive, inductive, resistive, etc.), a chip-level (SoC) or package-level integrated system 910, and a battery 913. As illustrated, the greater the level of integration in the system 910 enabled by higher transistor packing density, the greater the portion of the mobile computing platform 900 that may be occupied by the battery 913 or non-volatile storage, such as a solid state drive, or the greater the transistor gate count for improved platform functionality. Similarly, the greater the carrier mobility of each transistor in the system 910, the greater the functionality. As such, techniques described herein may enable performance and form factor improvements in the mobile computing platform 900.

The integrated system 910 is further illustrated in the expanded view 920. In the exemplary embodiment, packaged device 977 includes at least one memory chip (e.g., RAM), or at least one processor chip (e.g., a multi-core microprocessor and/or graphics processor) fabricated according to one or more processes described herein or including one or more features described herein. The packaged device 977 is further coupled to the board 960 along with one or more of a power management integrated circuit (PMIC) 915, RF (wireless) integrated circuit (RFIC) 925 including a wideband RF (wireless) transmitter and/or receiver (e.g., including a digital baseband and an analog front end module further including a power amplifier on a transmit path and a low noise amplifier on a receive path), and a controller thereof 911. Functionally, the PMIC 915 performs battery power regulation, DC-to-DC conversion, etc., and so has an input coupled to the battery 913 and with an output providing a current supply to all the other functional modules. As further illustrated, in the exemplary embodiment, the RFIC 925 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 977 or within a single IC (SoC) coupled to the package substrate of the packaged device 977.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 10:
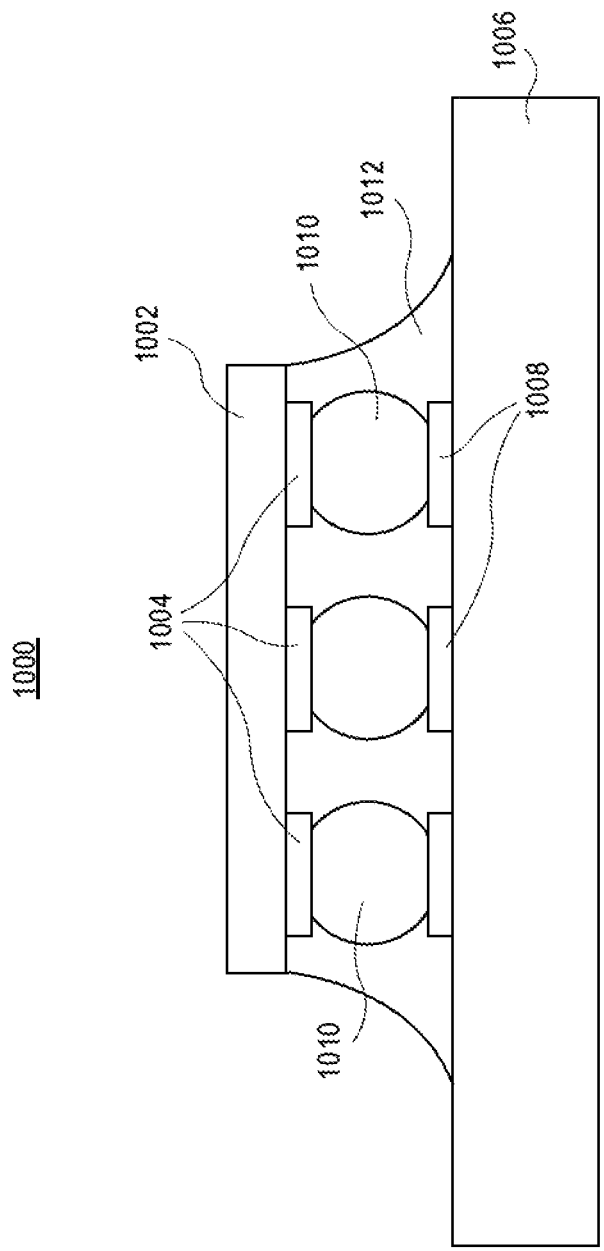
FIG. 10 illustrates a cross-sectional view of a flip-chip mounted die, in accordance with an embodiment of the present disclosure.

FIG. 10 illustrates a cross-sectional view of a flip-chip mounted die, in accordance with an embodiment of the present disclosure.

Referring to FIG. 10, an apparatus 1000 includes a die 1002 such as an integrated circuit (IC) fabricated according to one or more processes described herein or including one or more features described herein, in accordance with an embodiment of the present disclosure. The die 1002 includes metallized pads 1004 thereon. A package substrate 1006, such as a ceramic or organic substrate, includes connections 1008 thereon. The die 1002 and package substrate 1006 are electrically connected by solder balls 1010 coupled to the metallized pads 1004 and the connections 1008. An underfill material 1012 surrounds the solder balls 1010.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include advanced integrated circuit structure fabrication.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a fin including silicon. A gate structure is over the fin, the gate structure having a center. A conductive source trench contact is over the fin, the conductive source trench contact having a center spaced apart from the center of the gate structure by a first distance. A conductive drain trench contact is over the fin, the conductive drain trench contact having a center spaced apart from the center of the gate structure by a second distance, the second distance greater than the first distance by a factor of three.

Example embodiment 2: The integrated circuit structure of example embodiment 1, further including a dummy gate structure over the fin and between the gate structure and the conductive drain trench contact.

Example embodiment 3: The integrated circuit structure of example embodiment 2, wherein the dummy gate structure has a center spaced apart from the center of the gate structure by a third distance, the third distance greater than the first distance by a factor of two.

Example embodiment 4: The integrated circuit structure of example embodiment 2 or 3, further including a dummy trench contact structure over the fin and between the gate structure and the dummy gate structure.

Example embodiment 5: The integrated circuit structure of example embodiment 4, wherein the dummy trench contact structure has a center spaced apart from the center of the gate structure by a fourth distance, the fourth distance the same as the first distance.

Example embodiment 6: The integrated circuit structure of example embodiment 1, wherein a dummy gate structure is not located between the gate structure and the conductive drain trench contact.

Example embodiment 7: The integrated circuit structure of example embodiment 1, 2, 3, 4, 5 or 6, wherein the conductive source trench contact is on an epitaxial source structure in the fin, and the conductive drain trench contact is on an epitaxial drain structure in the fin.

Example embodiment 8: The integrated circuit structure of example embodiment 7, wherein the epitaxial source structure and the epitaxial drain structure have a substantially same width and height.

Example embodiment 9: The integrated circuit structure of example embodiment 7 or 8, further including an intervening epitaxial structure in the fin and between the epitaxial source structure and the epitaxial drain structure.

Example embodiment 10: The integrated circuit structure of example embodiment 7 or 8, wherein an intervening epitaxial structure is not included in the fin between the epitaxial source structure and the epitaxial drain structure.

Example embodiment 11: An integrated circuit structure includes a fin including silicon. A first conductive source trench contact is over the fin. A first gate structure is over the fin and neighboring the first conductive source trench contact, the first gate structure having a center. A first dummy gate structure is over the fin and neighboring the first gate structure, the first dummy gate structure having a center spaced apart from the center of the first gate structure by a pitch. A conductive drain trench contact is over the fin and neighboring the first dummy gate structure. A second dummy gate structure is over the fin and neighboring the conductive drain trench contact, the second dummy gate structure having a center spaced apart from the center of the first dummy gate structure by the pitch. A second gate structure is over the fin and neighboring the second dummy gate structure, the second gate structure having a center spaced apart from the center of the second dummy gate structure by the pitch. A second conductive source trench contact is over the fin and neighboring the second gate structure.

Example embodiment 12: The integrated circuit structure of example embodiment 11, wherein the first conductive source trench contact is on a first epitaxial source structure in the fin, the conductive drain trench contact is on an epitaxial drain structure in the fin, and the second conductive source trench contact is on a second epitaxial source structure in the fin.

Example embodiment 13: The integrated circuit structure of example embodiment 12, further including a first intervening epitaxial structure in the fin and between the first epitaxial source structure and the epitaxial drain structure, and a second intervening epitaxial structure in the fin and between the second epitaxial source structure and the epitaxial drain structure.

Example embodiment 14: The integrated circuit structure of example embodiment 12, wherein an intervening epitaxial structure is not included in the fin between the first epitaxial source structure and the epitaxial drain structure, and wherein an intervening epitaxial structure is not included in the fin between the second epitaxial source structure and the epitaxial drain structure.

Example embodiment 15: A computing device includes a board, and a component coupled to the board. The component includes an integrated circuit structure includes a fin including silicon. A gate structure is over the fin, the gate structure having a center. A conductive source trench contact is over the fin, the conductive source trench contact having a center spaced apart from the center of the gate structure by a first distance. A conductive drain trench contact is over the fin, the conductive drain trench contact having a center spaced apart from the center of the gate structure by a second distance, the second distance greater than the first distance by a factor of three.

Example embodiment 16: The computing device of example embodiment 15, further including a memory coupled to the board.

Example embodiment 17: The computing device of example embodiment 15 or 16, further including a communication chip coupled to the board.

Example embodiment 18: The computing device of example embodiment 15, 16 or 17, further including a camera coupled to the board.

Example embodiment 19: The computing device of example embodiment 15, 16, 17 or 18, further including a battery coupled to the board.

Example embodiment 20: The computing device of example embodiment 15, 16, 17, 18 or 19, further including an antenna coupled to the board.

Example embodiment 21: The computing device of example embodiment 15, 16, 17, 18, 19 or 20, wherein the component is a packaged integrated circuit die.

Example embodiment 22: The computing device of example embodiment 15, 16, 17, 18, 19, 20 or 21, wherein the component is selected from the group consisting of a processor, a communications chip, and a digital signal processor.

Example embodiment 23: The computing device of example embodiment 15, 16, 17, 18, 19, 20, 21 or 22, wherein the computing device is selected from the group consisting of a mobile phone, a laptop, a desk top computer, a server, and a set-top box.

What is claimed is:

1. An integrated circuit structure, comprising:
a fin comprising silicon;
a gate structure over the fin, the gate structure having a center;
a conductive source trench contact over the fin, the conductive source trench contact having a center spaced apart from the center of the gate structure by a first distance;
a conductive drain trench contact over the fin, the conductive drain trench contact having a center spaced apart from the center of the gate structure by a second distance, the second distance greater than the first distance by a factor of three, wherein the conductive source trench contact is on an epitaxial source structure in the fin, and the conductive drain trench contact is on an epitaxial drain structure in the fin;
an intervening epitaxial structure in the fin and between the gate structure and the epitaxial drain structure, the intervening epitaxial structure separate and distinct from the epitaxial drain structure; and
a dummy trench contact structure on the intervening epitaxial structure.

2. The integrated circuit structure of claim 1, further comprising a dummy gate structure over the fin and between the gate structure and the conductive drain trench contact.

3. The integrated circuit structure of claim 2, wherein the dummy gate structure has a center spaced apart from the center of the gate structure by a third distance, the third distance greater than the first distance by a factor of two.

4. The integrated circuit structure of claim 2, wherein the dummy trench contact structure is between the gate structure and the dummy gate structure.

5. The integrated circuit structure of claim 4, wherein the dummy trench contact structure has a center spaced apart from the center of the gate structure by a fourth distance, the fourth distance the same as the first distance.

6. The integrated circuit structure of claim 1, wherein the epitaxial source structure and the epitaxial drain structure have a substantially same width and height.

7. A computing device, comprising:
a board; and
a component coupled to the board, the component including an integrated circuit structure, comprising:
a fin comprising silicon;
a gate structure over the fin, the gate structure having a center;
a conductive source trench contact over the fin, the conductive source trench contact having a center spaced apart from the center of the gate structure by a first distance;
a conductive drain trench contact over the fin, the conductive drain trench contact having a center spaced apart from the center of the gate structure by a second distance, the second distance greater than the first distance by a factor of three, wherein the conductive source trench contact is on an epitaxial source structure in the fin, and the conductive drain trench contact is on an epitaxial drain structure in the fin;
an intervening epitaxial structure in the fin and between the gate structure and the epitaxial drain structure, the intervening epitaxial structure separate and distinct from the epitaxial drain structure; and
a dummy trench contact structure on the intervening epitaxial structure.

8. The computing device of claim 7, further comprising: a memory coupled to the board.

9. The computing device of claim 7, further comprising: a communication chip coupled to the board.

10. The computing device of claim 7, further comprising: a camera coupled to the board.

11. The computing device of claim 7, further comprising: a battery coupled to the board.

12. The computing device of claim 7, further comprising: an antenna coupled to the board.

13. The computing device of claim 7, wherein the component is a packaged integrated circuit die.

14. The computing device of claim 7, wherein the component is selected from the group consisting of a processor, a communications chip, and a digital signal processor.

15. The computing device of claim 7, wherein the computing device is selected from the group consisting of a mobile phone, a laptop, a desk top computer, a server, and a set-top box.

16. An integrated circuit structure, comprising:
- a fin comprising silicon;
- a gate structure over the fin, the gate structure having a center;
- a conductive source trench contact over the fin, the conductive source trench contact having a center spaced apart from the center of the gate structure by a first distance;
- a conductive drain trench contact over the fin, the conductive drain trench contact having a center spaced apart from the center of the gate structure by a second distance, the second distance greater than the first distance by a factor of three;
- a dummy gate structure over the fin and between the gate structure and the conductive drain trench contact; and
- a dummy trench contact structure over the fin and between the gate structure and the dummy gate structure.

17. The integrated circuit structure of claim 16, wherein the dummy gate structure has a center spaced apart from the center of the gate structure by a third distance, the third distance greater than the first distance by a factor of two.

18. The integrated circuit structure of claim 16, wherein the dummy trench contact structure has a center spaced apart from the center of the gate structure by a fourth distance, the fourth distance the same as the first distance.

* * * * *